(12) United States Patent
Botti et al.

(10) Patent No.: US 10,018,658 B2
(45) Date of Patent: Jul. 10, 2018

(54) CLASS D AUDIO AMPLIFIER AND METHOD FOR READING A CURRENT SUPPLIED BY THE AMPLIFIER

(71) Applicant: STMicroelectronics S.r.l., Agrate Brianza (IT)

(72) Inventors: Edoardo Botti, Vigevano (IT); Marco Raimondi, Busto Garolfo (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 15/212,200

(22) Filed: Jul. 16, 2016

(65) Prior Publication Data
US 2017/0160316 A1    Jun. 8, 2017

(30) Foreign Application Priority Data

Dec. 7, 2015 (IT) ................ 102015800985

(51) Int. Cl.
| H03F 3/217 | (2006.01) |
| G01R 19/10 | (2006.01) |
| H03F 1/32  | (2006.01) |
| H03F 1/52  | (2006.01) |
| H03F 3/185 | (2006.01) |

(52) U.S. Cl.
CPC .......... *G01R 19/10* (2013.01); *H03F 1/3205* (2013.01); *H03F 1/523* (2013.01); *H03F 3/185* (2013.01); *H03F 3/2173* (2013.01); *H03F 2200/03* (2013.01); *H03F 2200/171* (2013.01); *H03F 2200/393* (2013.01); *H03F 2200/444* (2013.01); *H03F 2200/456* (2013.01); *H03F 2200/462* (2013.01); *H03F 2200/471* (2013.01); *H03F 2200/481* (2013.01)

(58) Field of Classification Search
CPC .... H03F 3/217; H03F 3/2173; H03F 2200/33; H03F 3/3061
USPC ........................................ 330/251, 207 A, 10
See application file for complete search history.

(56) References Cited

U.S. PATENT DOCUMENTS

| 2010/0102845 A1 | 4/2010 | Kadow et al. |
| 2011/0012677 A1* | 1/2011 | Dooper ................ H03F 3/2173 330/251 |
| 2012/0044020 A1 | 2/2012 | Siniscalchi et al. |

FOREIGN PATENT DOCUMENTS

| EP | 2015086 A1 | 1/2009 |
| EP | 2562932 A1 | 2/2013 |

* cited by examiner

*Primary Examiner* — Khanh V Nguyen
*Assistant Examiner* — Khiem Nguyen
(74) *Attorney, Agent, or Firm* — Slater Matsil, LLP

(57) ABSTRACT

A circuit includes a final stage that includes an H-bridge comprising first and second half-bridges. A read circuit is configured to read a load current supplied by a class-D audio-amplifier to a load. The read circuit is configured for estimating the load current by reading a current at an output by the first or second half-bridge by measuring a drain-to-source voltage during an ON period of a power transistor of the H-bridge. A sensing circuit is configured to detect a first drain-to-source voltage from a transistor of the first half-bridge and a second drain-to-source voltage from a corresponding transistor of the second half-bridge. The sensing circuit is also configured to compute a difference between the first drain-to-source voltage and the second drain-to-source voltage and to perform an averaging operation on the difference to obtain a sense voltage value to be supplied to an analog-to-digital converter.

20 Claims, 11 Drawing Sheets

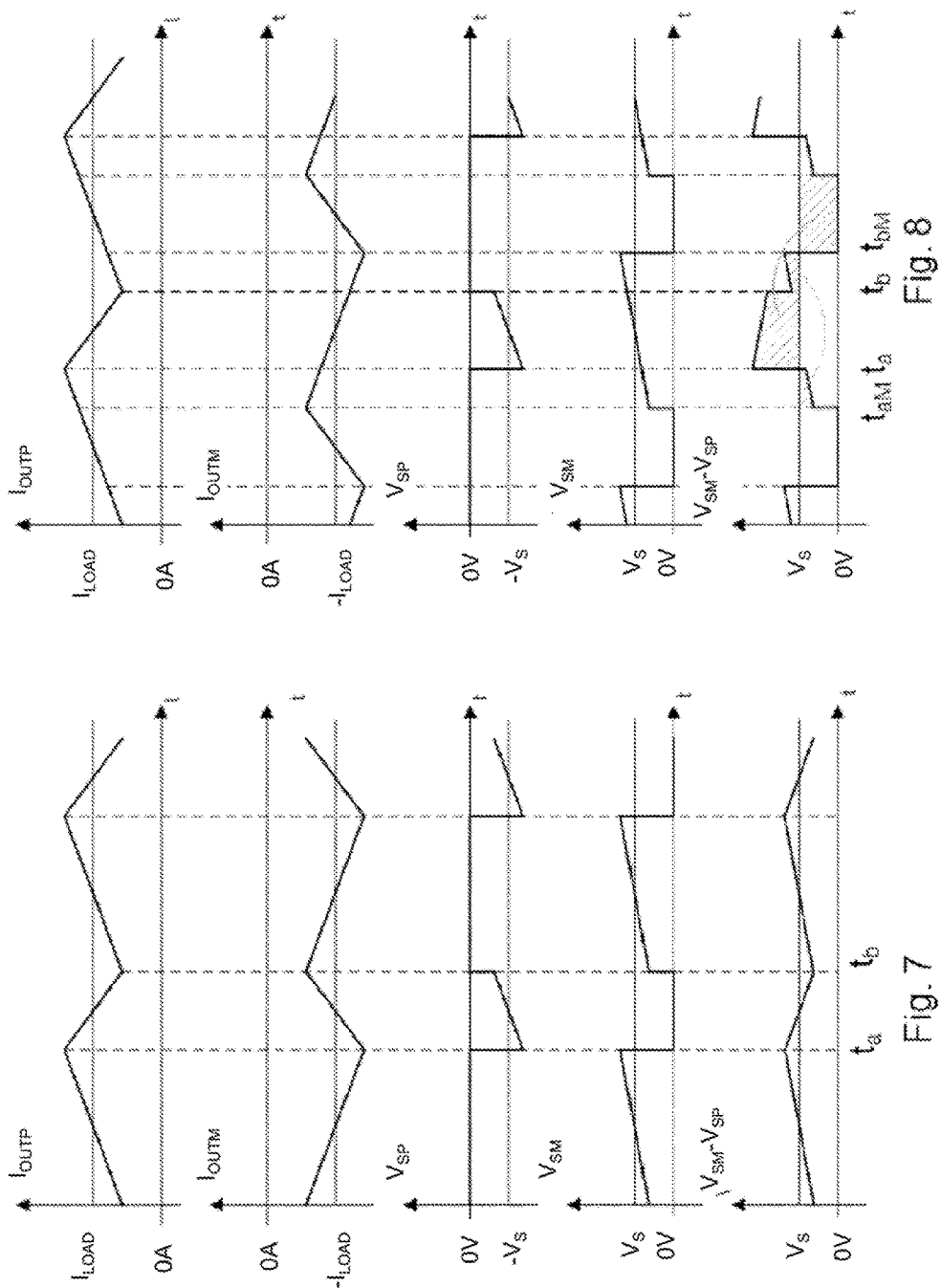

CLASS D AUDIO AMPLIFIER AND METHOD FOR READING A CURRENT SUPPLIED BY THE AMPLIFIER

CROSS-REFERENCE TO RELATED APPLICATIONS

This application claims priority to Italian Application No. 102015000080985, filed on Dec. 7, 2015, which application is hereby incorporated herein by reference.

TECHNICAL FIELD

Embodiments of the present invention relate to a class-D audio amplifier comprising a circuit for reading a current supplied by the amplifier to the load. Further embodiments relate to a corresponding reading method.

BACKGROUND

In class-D audio amplifiers, for various reasons, such as diagnostics of the state of speakers or else for applying thereto linearization techniques, there frequently arises the need to read accurately the current that the final stage supplies to the load.

Since it is not generally convenient to resort to costly and cumbersome external circuits for current sensing, recourse is had to internal sensing, by measuring the current supplied by power MOSFETs. At low frequency these currents are equal to the load current in so far as the current that flows in filter capacitors is negligible.

In this connection, FIG. 1 illustrates a full-H bridge 11 of a final stage of a power audio amplification circuit. The architecture of the final stage of a class-D amplification circuit is in itself known to the person skilled in the sector, and in general comprises a comparator, which compares the input signal with a signal produced by a triangular-wave generator for supplying a PWM driving signal to a switching controller, which in turn controls the states of opening and closing of the MOSFETs of the H bridge 11, to the gate electrodes of which it supplies the PWM driving signal. The H bridge 11 is a full bridge, which comprises two half-bridges: a first half-bridge 12, which comprises a high-side power MOSFET 13a, i.e., one connected to the supply VDD, and a low-side power MOSFET 13b, i.e., one connected to ground GND, which supply, to a first output node OUTP that is common between the drain electrode of the low-side transistor and the source electrode of the high-side transistor, a first output current $I_{OUT}$; and a second half-bridge 22, which comprises a respective high-side MOSFET 23a and a respective low-side MOSFET 23b that supply to a second output node OUTM a second current $I_{OUTM}$.

The output current $I_{OUTP}$, $I_{OUTM}$ of each half-bridge 12, 22 of the bridge 11 is supplied, through a corresponding LC filter 14, 24, the function of which is also in itself known to the person skilled in the sector of class-D audio amplifiers and is not described any further herein, to the input terminals of a speaker 15, on which it determines a load current $I_{LOAD}$. It should be noted that in FIG. 1 the high-side transistors are of an n-channel type, but they may also be of a p-channel type, in which case the output current is detected on the drain electrode.

The solution currently adopted for carrying out reading of the load current $I_{LOAD}$ is represented with reference to the circuit diagram of FIG. 2 and to the corresponding time plot of FIG. 3.

It envisages sampling a drain-to-source voltage $V_{DSLP}$ of the low-side transistor 13b (or 23b) of the circuit of FIG. 1 at the instant, designated by $t_s$ in FIG. 3, in which the current ripple due to the finite inductance of the external LC filter 14 (or 24) vanishes.

This is obtained via a sensing circuit 30, which comprises a pre-amplifier 31 for carrying out reading of the drain-to-source voltage $V_{DSLP}$ of the low-side transistor 13b, the pre-amplifier 31 being connected with its two input pins to the drain and to the source of the low-side transistor 13b via driven protection switches 32 inserted on each connection between the drain and source and the respective pins of the preamplifier 31. These switches 32 are driven by a protection signal, SWPRP, so as to protect the preamplifier 31 from high voltage, whilst further sampling switches set on the outputs of the preamplifier 31 constitute, together with respective sampling capacitors, connected to the analog ground AGND, a sample and hold circuit 33, driven by a corresponding sample and hold signal SWSH, which drives the states of opening and closing of the switches of the circuit 33, for an analog-to-digital converter (ADC) 34.

In this regard, FIG. 3 illustrates plots representing as a function of time t the first output current $I_{OUTP}$, the drain-to-source voltage $V_{DSLP}$, the protection signal SWPRP, and the sample and hold driving signal SWSH. As may be noted, the drain-to-source voltage $V_{DSLP}$ is sampled at a sampling instant $t_s$, where, at d.c. and at low frequencies, it is proportional to the load current $I_{LOAD}$ through the switch-on resistance $R_{DSONLP}$ of the low-side transistor 13b.

Moreover, designated by $t_a$ in FIG. 3 is the instant of turning-off of the high-side MOSFET, for example 13a, and turning-on of the low-side MOSFET, for example 13b. Designated by $t_b$ is the instant of turning-off of the low-side transistor and turning-on of the high-side transistor.

Once the drain-to-source voltage $V_{DSLP}$ has been sampled, the information on current is obtained from the comparison with a reference drain-to-source voltage $V_{DSREF}$. This reference drain-to-source voltage $V_{DSREF}$ is generated by a reference power MOSFET 13c (illustrated in FIG. 4), electrically and thermally coupled to the MOSFET 13b that delivers the first output current $I_{OUTP}$, with known aspect ratio and current.

By computing the ratio between the drain-to-source voltage $V_{DSLP}$ and the reference drain-to-source voltage $V_{DSREF}$, the first output current $I_{OUTP}$ is obtained, as shown in FIG. 4, where designated by IREF is the current of a reference-current generator 16, which forces the current into the drain of the MOSFET 13c. The drain-to-source switch-on resistances the MOSFETs 13b and 13c are designated as $R_{DSONLP}$ and $R_{DSREF}$. The output current $I_{OUTP}$ can thus be computed according to these quantities as follows:

$$V_{DSREF} = R_{DSREF} \cdot I_{REF}$$

$$V_{DSLP} = R_{DSONLP} \cdot (-I_{OUTP})$$

$$I_{OUTP} = -(I_{REF} \cdot R_{DSREF}/R_{DSONLP}) \cdot V_{DSLP}/V_{DSREF}$$

The drain-to-source voltages $V_{DSLP}$ and $V_{DSREF}$ are measured through the sensing circuit 30 of FIG. 2, whereas the other parameters are known design parameters or are obtained following upon a further trimming operation.

The circuit just described with reference to FIGS. 2 and 3 presents various limitations.

As shown in the plot of FIG. 5, which represents the output current $I_{OUTP}$ and a corresponding current $I_{SAMP}$ sampled by the circuit 30, an error on the sampling instant $t_s$ causes in fact a reading error. Ideally, sampling of the drain-to-source voltage $V_{DSLP}$ must be carried out when the effect of the ripple in the inductance of the LC filter 14 is zero and the output current $I_{OUTP}$ is equal to the mean value of the load current $I_{LOAD}$. If sampling is not made at this instant, but after a time $\Delta t$, superimposed on the signal is an undesirable current contribution $\Delta I$ due to the ripple current, as emerges from FIG. 5, represented in which are the current $I_{LOAD}$ and two values of current $I_{IDEAL}$ and $I_{SAMP}$, one evaluated at the ideal sampling time $t_{IDEAL}$ and the other at the effective sampling time $t_{SAMP}=t_{IDEAL}+\Delta t$.

Sampling is moreover limited by saturation of the final stage.

When the signal grows, the duty cycle of the low-side transistor decreases (this time interval is represented by the high level of the protection signal SWPRP in FIG. 3). When the duty cycle becomes comparable to or shorter than the time of charging of the gate, plus the settling time both of the reading circuit and of the sample and hold circuit, it is no longer possible to make an accurate reading of the current. With reference to FIG. 3, this means that the time interval in which the sample and hold signal SWSH is high is too short. To prevent this problem linked to saturation, beyond a certain level of signal it would be possible to choose to switch the reading of current on the other half-bridge, but switching of reading to the other half-bridge entails the high risk of incurring in discontinuities.

SUMMARY

The present disclosure relates to a class-D audio amplifier comprising a circuit for reading a current supplied by the amplifier to a load, the amplifier including a final stage, which comprises an H bridge that includes a first half-bridge and a second half-bridge, the circuit for reading a load current being configured for estimating the load current through reading of a current supplied at output by at least one half-bridge by measuring a drain-to-source voltage during an ON period of at least one power transistor, in particular a low-side transistor, of the first half-bridge or the second half-bridge.

Various embodiments may be applied to audio power amplifiers, but also to other full-bridge stages that require detection of the load current.

Embodiments described herein improve the potential of the circuits according to the known art, as discussed previously.

Various embodiments may envisage that the amplifier apparatus described comprises a sensing circuit including a circuit portion for detecting a first drain-to-source voltage from a transistor of the first half-bridge, and a second drain-to-source voltage from a corresponding transistor of the second half-bridge. The sensing circuit includes a module for computing a difference between the first drain-to-source voltage and the second drain-to-source voltage that are detected by the circuit portion, and also includes a module for performing an averaging operation on the difference to obtain a sense voltage value to be supplied to an analog-to-digital converter.

Various embodiments may envisage that the module for computing the difference between the first detected drain-to-source voltage and the second detected drain-to-source voltage is a differential amplifier.

Various embodiments may envisage that the module for performing an averaging operation on the difference to obtain a sense voltage value is a low-pass filter.

Various embodiments may envisage that the circuit portion for detecting a first drain-to-source voltage from a transistor of the first half-bridge and a second drain-to-source voltage from a corresponding transistor of the second half-bridge comprises respective protection switches set between the drain and source nodes of the transistors of the first half-bridge and of the second half-bridge, and the respective inputs of the one module for computing the difference between the first detected drain-to-source voltage and the second detected drain-to-source voltage.

Various embodiments may envisage that the circuit portion for detecting a first drain-to-source voltage from a transistor of the first half-bridge and a second drain-to-source voltage from a corresponding transistor of the second half-bridge comprises respective sensing networks, which include an auxiliary transistor, the gate and drain of which are connected, respectively, to the gate and drain of the respective transistor of the first half-bridge or the second half-bridge, and a sense resistance between the source of the auxiliary transistor and the ground of the corresponding half-bridge.

Various embodiments may envisage that the sense resistance is sized so that it has a value much higher than a switch-on resistance of the auxiliary transistor, such as to render the sum of the switch-on resistance of the auxiliary transistor and of the sense resistance approximately equal to the sense resistance.

Various embodiments may envisage that the sense resistance is sized so that it has a value much lower than a switch-on resistance of the auxiliary transistor, such as to render the sum of the switch-on resistance of the auxiliary transistor and of the sense resistance approximately equal to the switch-on resistance.

Various embodiments may envisage that the apparatus comprises a reference power MOSFET that generates a reference drain-to-source voltage, which is electrically and thermally coupled to the power transistor that delivers the output current, with known aspect ratio and current.

Various embodiments may be aimed at providing a method for reading a load current supplied by a class-D audio amplifier to a load, which comprises detecting a first drain-to-source voltage from a transistor of the first half-bridge and a second drain-to-source voltage from a corresponding transistor of the second half-bridge, computing a difference between the first detected drain-to-source voltage and the second detected drain-to-source voltage, and performing an averaging operation on the difference to obtain a sense voltage value to be supplied to an analog-to-digital converter.

BRIEF DESCRIPTION OF THE DRAWINGS

Various embodiments will now be described, purely by way of example, with reference to the annexed drawings, wherein:

FIGS. 7 and 8 show time plots of quantities in an amplifier apparatus that uses the sensing circuit of FIG. 6A;

DETAILED DESCRIPTION OF ILLUSTRATIVE EMBODIMENTS

In the ensuing description numerous specific details are provided in order to enable maximum understanding of the embodiments provided by way of example. The embodiments may be implemented with or without specific details, or else with other methods, components, materials, etc. In other circumstances, well-known structures, materials, or operations are not illustrated or described in detail so that various aspects of the embodiments will not be obscured. Reference, in the course of this description, to "an embodiment" or "one embodiment" means that a particular feature, structure, or characteristic described in connection with the embodiment is comprised in at least one embodiment. Hence, phrases such as "in an embodiment", "in one embodiment", or the like that may be present in various points of the present description do not necessarily refer to one and the same embodiment. Moreover, the particular features, structures, or characteristics may be combined in any convenient way in one or more embodiments.

The notation and references are provided herein merely for convenience of the reader and do not define the scope or meaning of the embodiments.

The idea underlying the solution described herein is to exploit the information of current of both of the half-bridges, and hence to detect a first drain-to-source voltage, preferably from a low-side transistor of the first half-bridge, and a second drain-to-source voltage from a corresponding low-side transistor of the second half-bridge. The sampling operation is replaced by an operation of averaging on a difference between the first detected drain-to-source voltage and the second detected drain-to-source voltage, obtained, for example, via a differential amplifier, to obtain a sense voltage value to be supplied to an analog-to-digital converter. The averaging operation is preferably carried out via a low-pass filtering of the difference between the signal present on the MOSFET, for example the low-side MOSFET, of the H bridge during its ON period, and the signal present on the corresponding transistor of the other half-bridge during its ON period.

Operation in the case of sensing performed on the low-side power transistors is described with reference to FIGS. 6A, 7, and 8.

Figure 3:
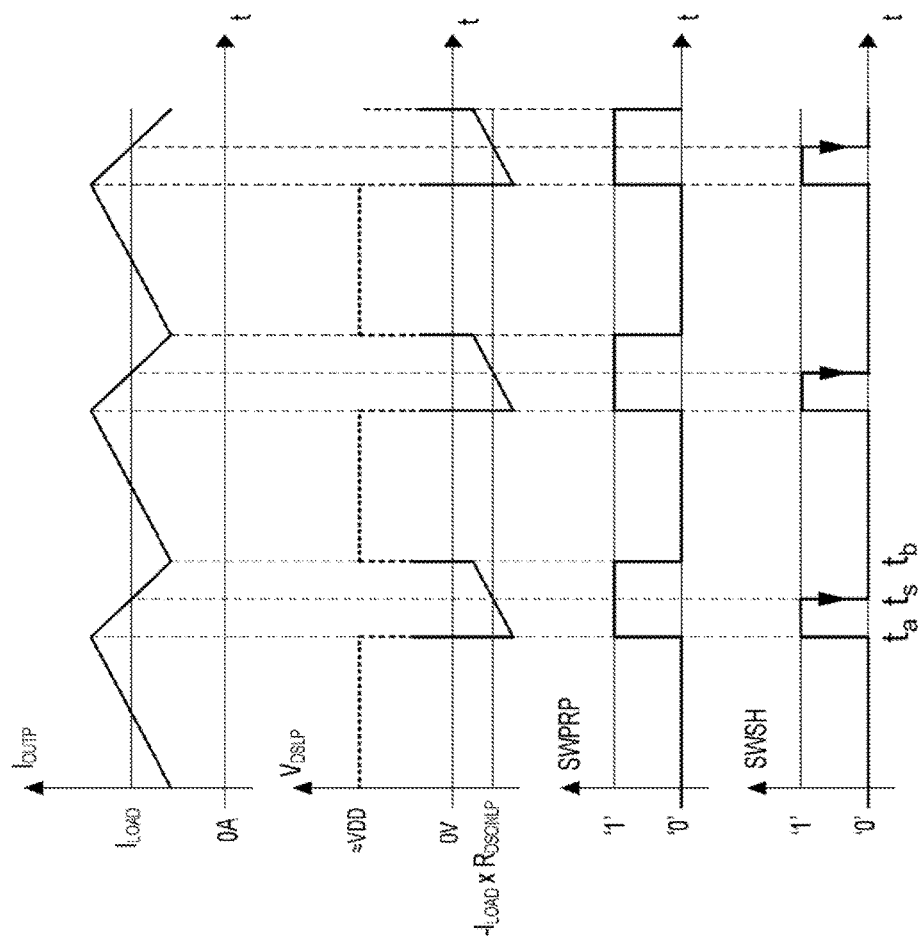
FIG. 3 illustrates a time plot corresponding to the circuit diagram of FIG. 2.
Figure 5:
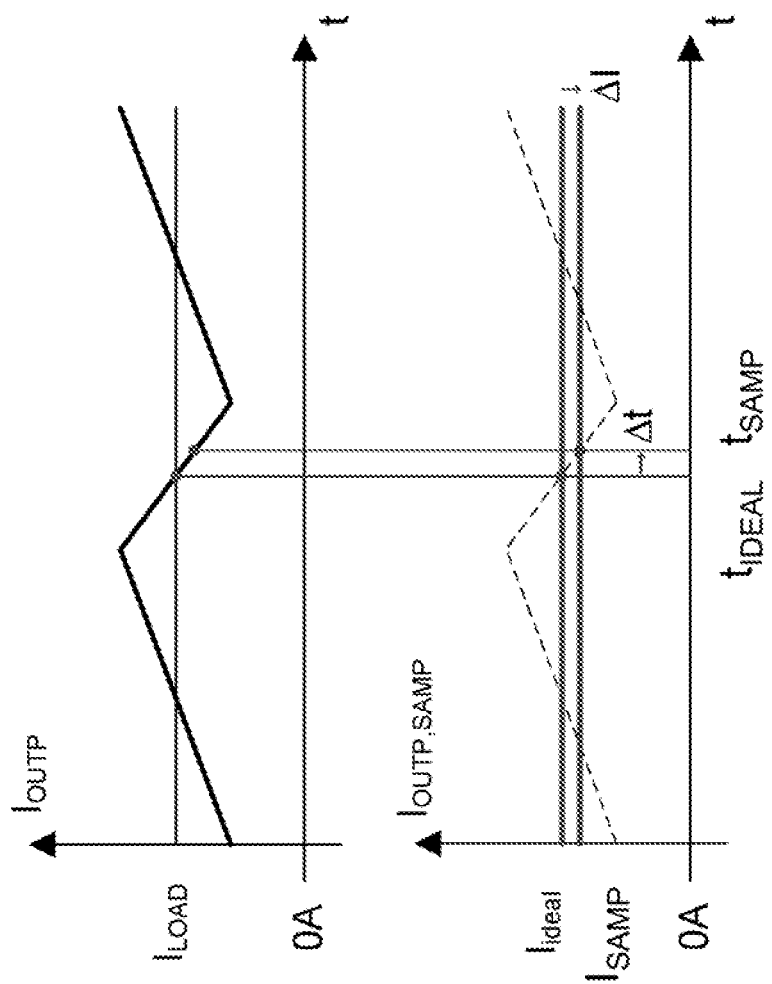
FIG. 5 illustrates a plot that represents an output current and a corresponding sampled current.
Figure 6A:
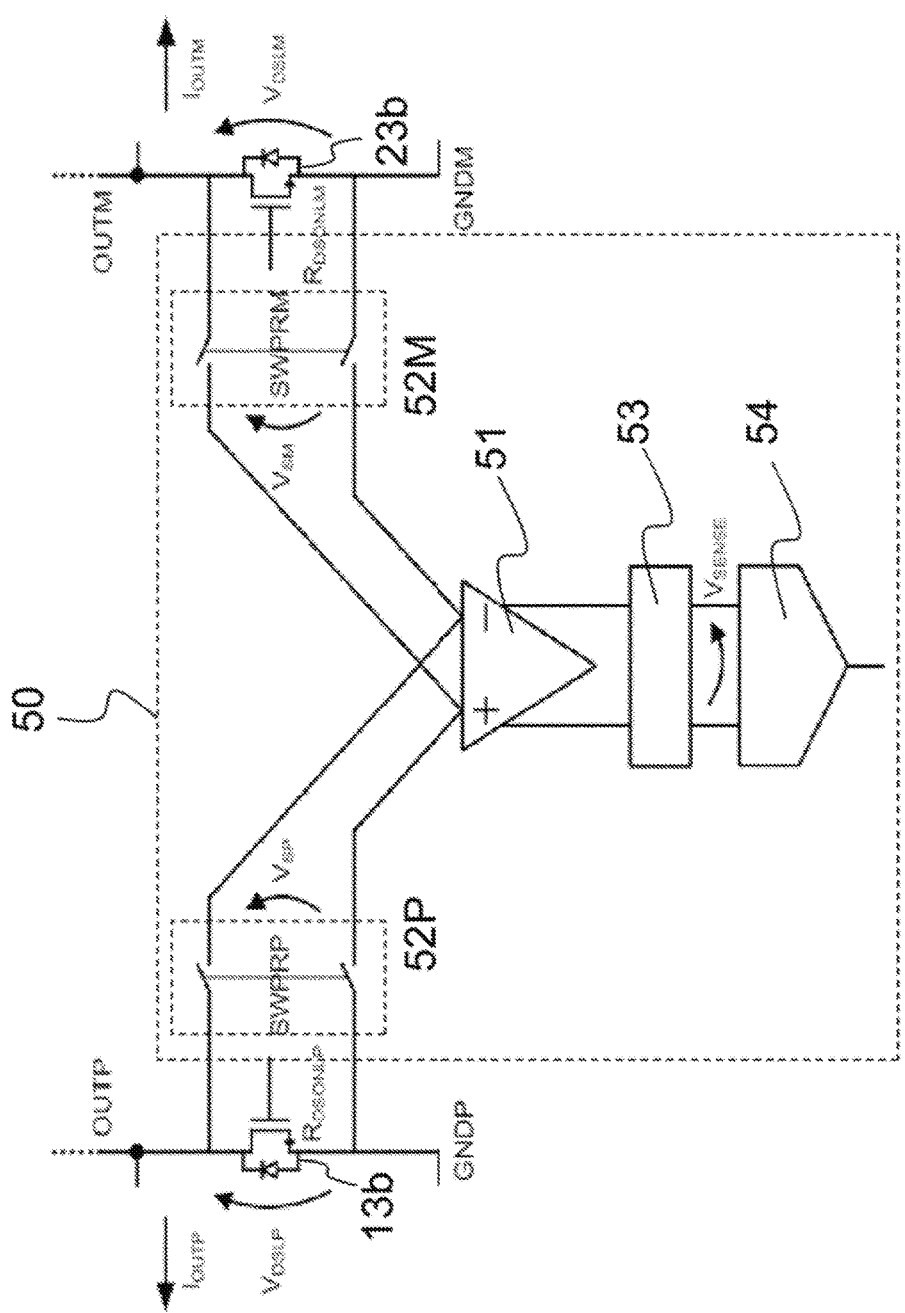
FIG. 6A is a schematic illustration of a sensing circuit of the amplifier apparatus described.

FIG. 6A shows a block diagram, where a sensing circuit 50 comprises a differential preamplifier 51, the input pins of which are connected, through switches 52P, a first one to the drain and a second one to the source of the low-side MOSFET 13b, and, through switches 52M, the first one to the drain and the second one to the source of the low-side MOSFET 23b of the half-bridge 22. Downstream of the switches 52P and 52M respective first and second sense voltages VSP and VSM are formed, which correspond to the drain-to-source voltages detected, supplied to the differential inputs of the preamplifier 51. The switches 52P connected to the first half-bridge 12 are driven by a protection signal SWPRP similar to that of FIG. 3, whereas the second switches 52M are driven via a protection signal SWPRM that has ON states, which are complementary in the case of out-of-phase modulation (FIG. 7), whereas in the case of in-phase modulation (FIG. 8) anyway coincide with the ON interval of the respective low-side transistor (taM for the second half-bridge). Hence, the protection switches 52P and 52M represent a circuit portion, or network, for detecting a first drain-to-source voltage VSP from a transistor 13b of the first half-bridge 12 and a second drain-to-source voltage VSM from a corresponding transistor 23b of the second half-bridge 22 via respective protection switches 52P, 52M set between the drain and source nodes of the transistors of the first half-bridge 12 and of the second half-bridge 22 and the preamplifier 51. This preamplifier 51 provides a module for computing a difference between the first detected drain-to-source voltage VSP and the second detected drain-to-source voltage VSM.

Figure 6B:
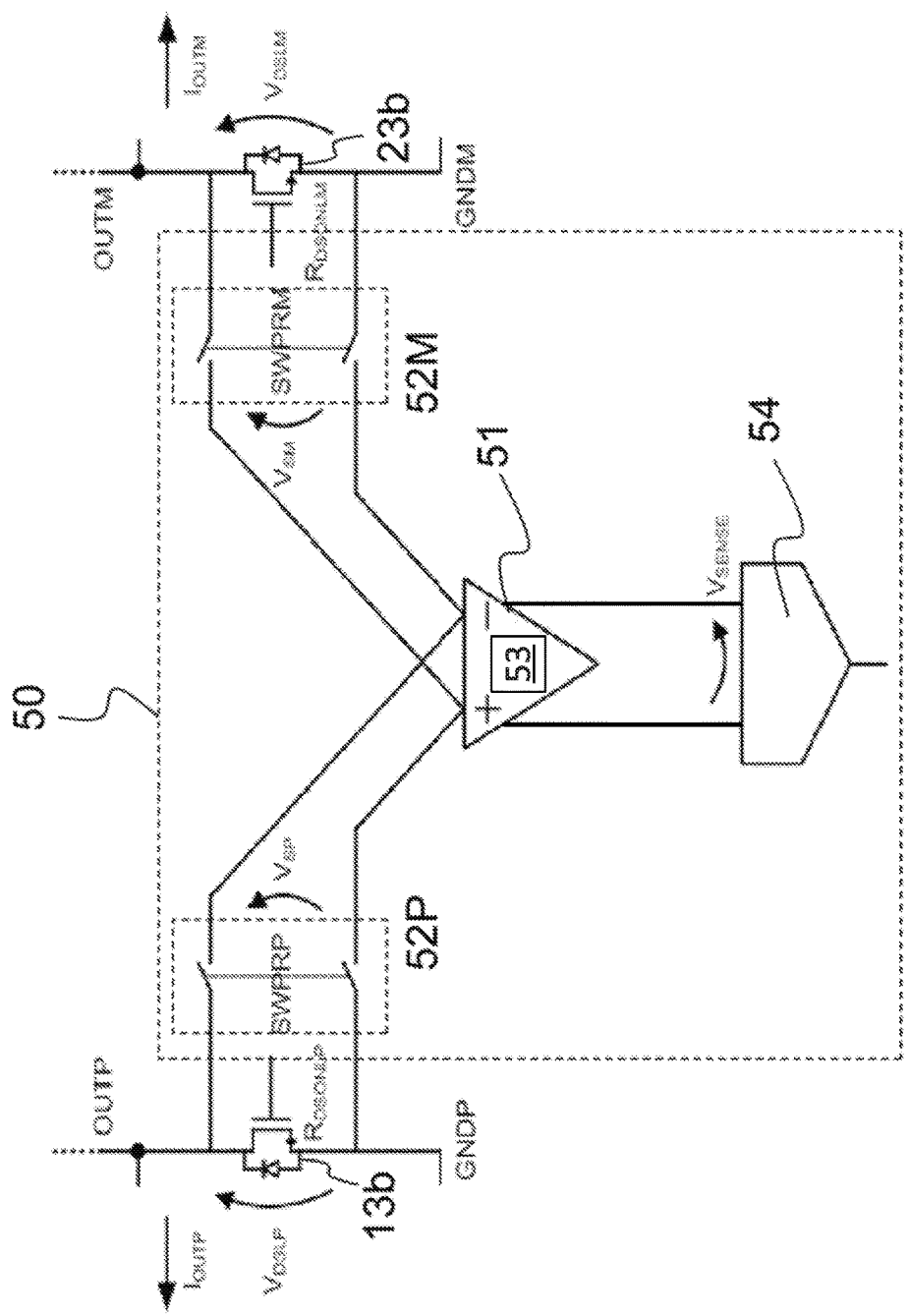
FIG. 6B is another schematic illustration of a sensing circuit of the amplifier apparatus described.

Connected to the output of the preamplifier 51 is a low-pass filter 53, at the output of which a resulting sense voltage VSENSE is formed. The low-pass filter 53 may also be integrated in the differential amplifier 51 and hence not be a block cascaded thereto, as shown in FIG. 6B. The low-pass filter 53 provides a module for performing a continuous-time averaging of the difference to obtain a sense voltage value VSENSE to be supplied to an analog-to-digital converter 54.

In this regard, illustrated in FIGS. 7 and 8 are plots representing, as a function of time t, the first output current IOUTP, the second output current IOUTM, the first sense voltage VSP, the second sense voltage VSM, and the difference between the first sense voltage and the second sense voltage, VSM-VSP. FIG. 7 shows the waveforms for out-of-phase modulation, and FIG. 8 shows the waveforms for in-phase modulation. As may be noted, the difference VSM-VSP, which corresponds, through the amplification ratio, to the resulting sense voltage VSENSE, determines, through the low-pass filter 53, an average sense signal with value VS, both for the in-phase case and for the out-of-phase case. Consequently, the sensing circuit 50 provides a continuous-time reading method that enables a greater accuracy in so far as the averaging operation eliminates the contribution of the ripple with zero mean value of the current in the finite inductance of the LC filter 14 or 24.

Figure 1:
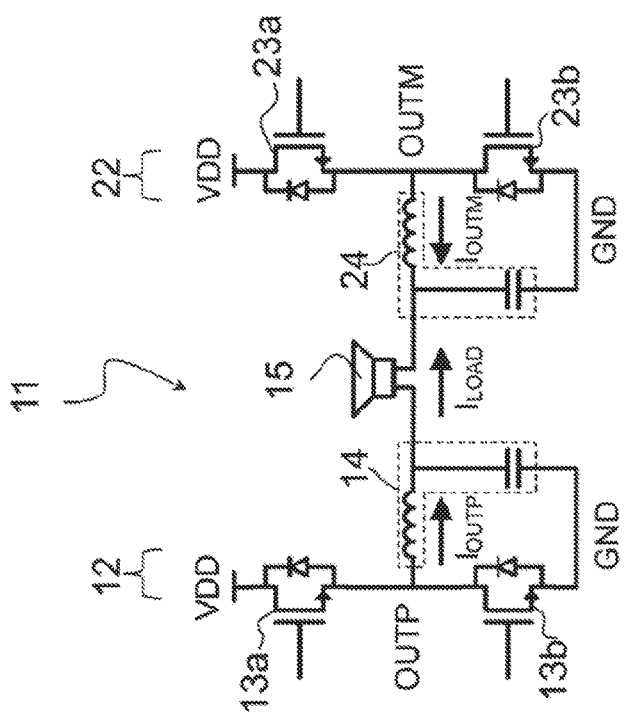
FIG. 1 illustrates a full-H bridge 11 of a final stage of a power audio amplification circuit.

It may be noted that it is moreover possible to read the current even in the absence of the LC filter 14 or 24 in the circuit n of FIG. 1, a solution that eliminates the band limitations in so far as this modification causes the load current $I_{LOAD}$ to be equal to the first output current $I_{OUTP}$ and to the negative value of the second output current $-I_{OUTM}$ not only at low frequencies.

Saturation of the reading system for high values of duty cycle is intrinsically eliminated.

Figure 2:
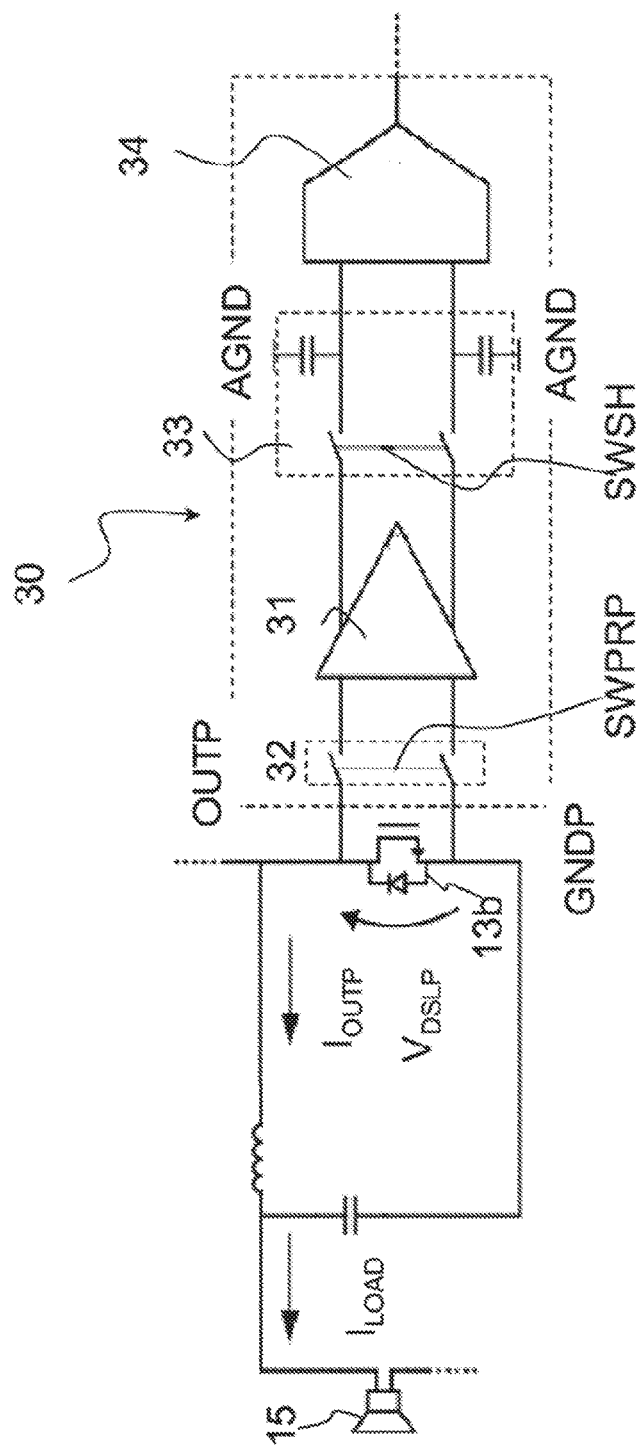
FIG. 2 illustrates a circuit diagram.

Finally, it is possible to eliminate the circuits for generation of the signals for the sample and hold circuit (SWSH in FIG. 2).

Figure 9:
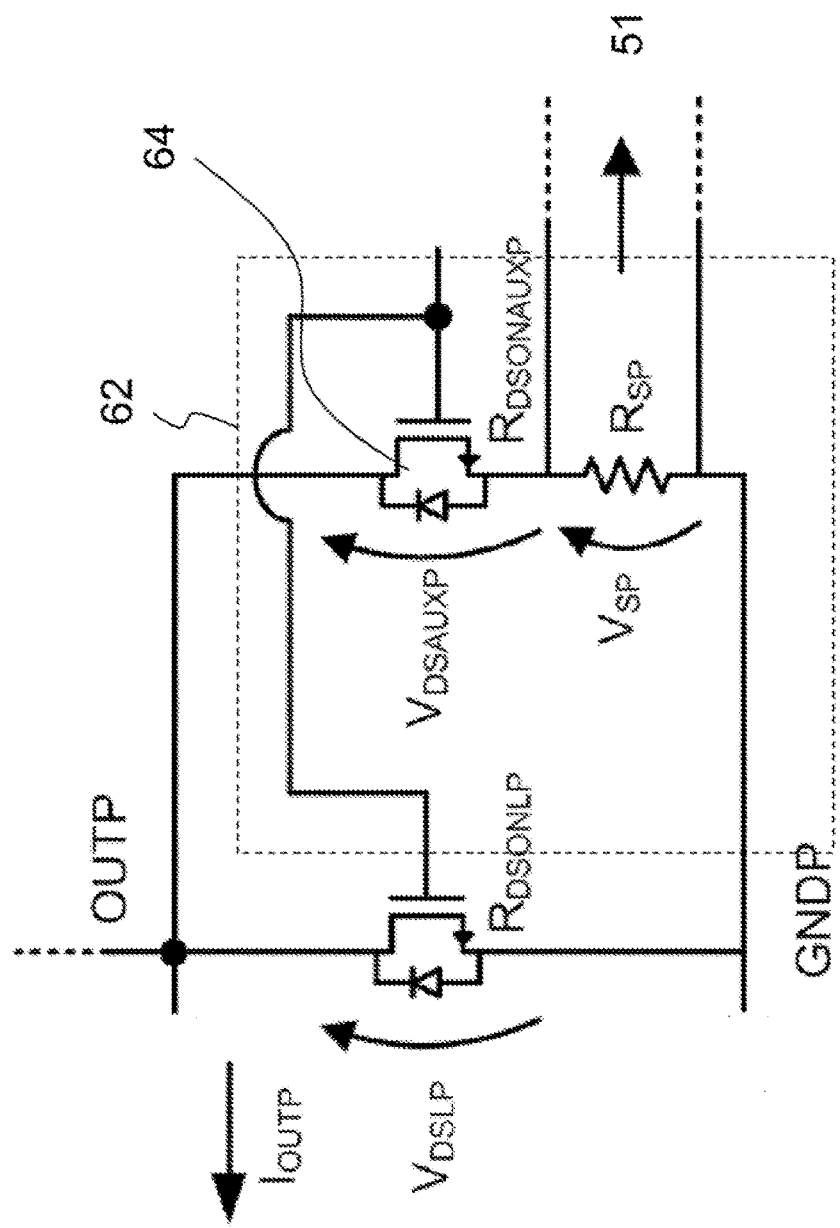
FIG. 9 is a schematic illustration of a variant embodiment of the sensing circuit of FIG. 6A.

FIG. 9 illustrates a preferred alternative embodiment for generation of the first sense voltage $V_{SP}$ and of the second sense voltage $V_{SM}$ to be supplied to the differential inputs of the preamplifier 51, which envisages replacement of each switch 52P and 52M with a respective sensing network 62 shown in FIG. 9. This sensing network 62 comprises an auxiliary transistor 64, of the same type as the transistor 13b or 23b, in general with an appropriate scale ratio that will guarantee thermal matching with the corresponding low-side transistor 13b or 23b. The scale ratio is chosen as a compromise between occupation of area and matching. The smaller the area ratio (or $R_{DSON}$ ratio) between the MOSFET 13b or 23b and the auxiliary transistor 62, the better, in general, the matching. With reference to what is referred to in what follows, this is valid when it is desired to operate in a partitioning mode, described hereinafter. In the case, instead, of operation in a sensing mode, once again described in what follows, a good coupling between the MOSFET 13b or 23b and the auxiliary transistor 62 is no longer necessary.

The gate and drain of the auxiliary transistor 64 are connected, respectively, to the gate and drain of the low-side transistor 13b. A sense resistance $R_{SP}$, sized for example as described hereinafter to obtain two different operating modes, is set between the source of the auxiliary transistor 64 and the ground GNDP of the half-bridge 12. Between the sensing resistances $R_{SP}$ and $R_{SM}$, respectively, of the two half-bridges and the preamplifier 51 a further amplification stage may possibly be inserted.

Figure 10:
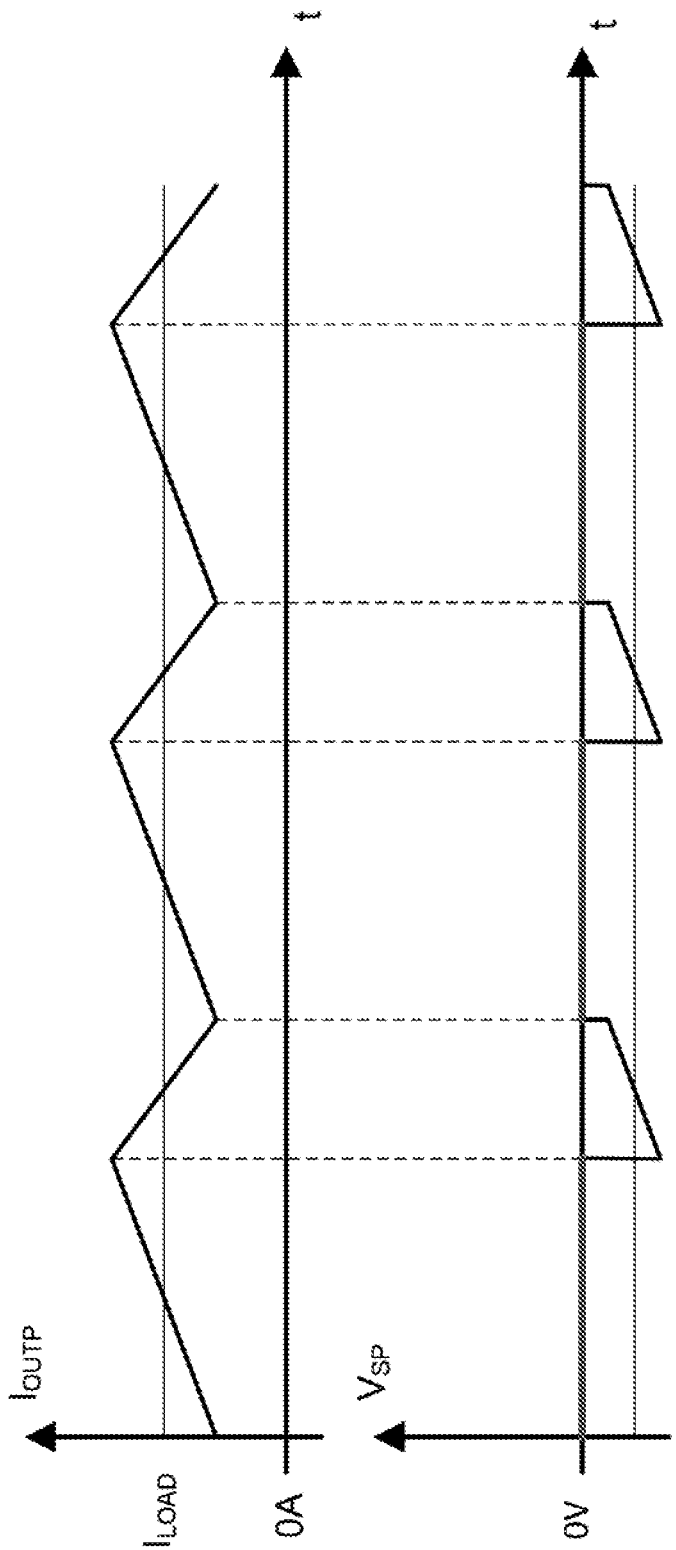
FIG. 10 shows time plots of quantities in an amplifier apparatus that uses the sensing circuit of FIG. 9.

Thanks to the added sensing network 62, during the OFF step of the low-side transistor 13b the sense signals $V_{SP}$ and $V_{SM}$ have a value of o V instead of the value of the supply voltage VDD, as represented in FIG. 10, which shows the first output current $I_{OUTP}$ and the first sense voltage $V_{SP}$ as a function of time t, compatibly with the operation described with reference to FIGS. 7 and 8.

As further advantage, the reading electronics is automatically protected from the high voltage, and hence it is not necessary to resort to further protective circuitry, i.e., the switches 52P and 52M.

According to the mutual sizing between the switch-on resistance $R_{DSONAUXP}$ of the auxiliary transistor 64 and the sense resistance $R_{SP}$, it may possible to choose two different operating modes, taking into account that for the circuit of FIG. 9 we have:

$$R_{DSONLP} << R_{DSONAUXP} + R_{SP}$$

$$V_{SP} = -I_{OUTP} \cdot (R_{DSONLP} \cdot R_{SP}) / (R_{DSONLP} + R_{DSONAUXP} + R_{SP}) \approx$$

$$-I_{OUTP} \cdot (R_{DSONLP} \cdot R_{SP}) / (R_{DSONAUXP} + R_{SP})$$

In a first, sensing, mode the sense resistance $R_{SP}$ is sized so that it has a value much higher than the switch-on resistance $R_{DSONAUXP}$ of the auxiliary transistor 64, in particular such as to render the sum of the switch-on resistance $R_{DSONAUXP}$ of the auxiliary transistor 64 and of the sense resistance $R_{SP}$ approximately equal to the sense resistance $R_{SP}$ in the relation appearing above that expresses the sense voltage $V_{SP}$. In this way, the first sense voltage $V_{SP}$ is approximately equal to $-I_{OUTP} \cdot R_{DSONLP}$, and sensing of the drain-to-source voltage $V_{DSLP}$ of the low-side transistor 13b is carried out.

In a second, partitioning, mode, the sense resistance $R_{SP}$ is sized so that it has a value much lower than the switch-on resistance $R_{DSONAUXP}$, in particular such as to render the sum of the switch-on resistance $R_{DSONAUXP}$ of the auxiliary transistor 64 and of the sense resistance $R_{SP}$ approximately equal to the switch-on resistance $R_{DSONAUXP}$ in the relation appearing above that expresses the sense voltage $V_{SP}$. Hence, the first sense voltage $V_{SP}$ is approximately equal to $-I_{OUTP} \cdot (R_{DSONLP}/R_{DSONAUXP}) \cdot R_{SP})$, and thus the sensing operation is carried out on a partitioning of known value of the first output current $I_{OUTP}$.

Of course, similar arguments apply in a dual way to the low-side transistor 23b of the second half-bridge 22.

Figure 11:
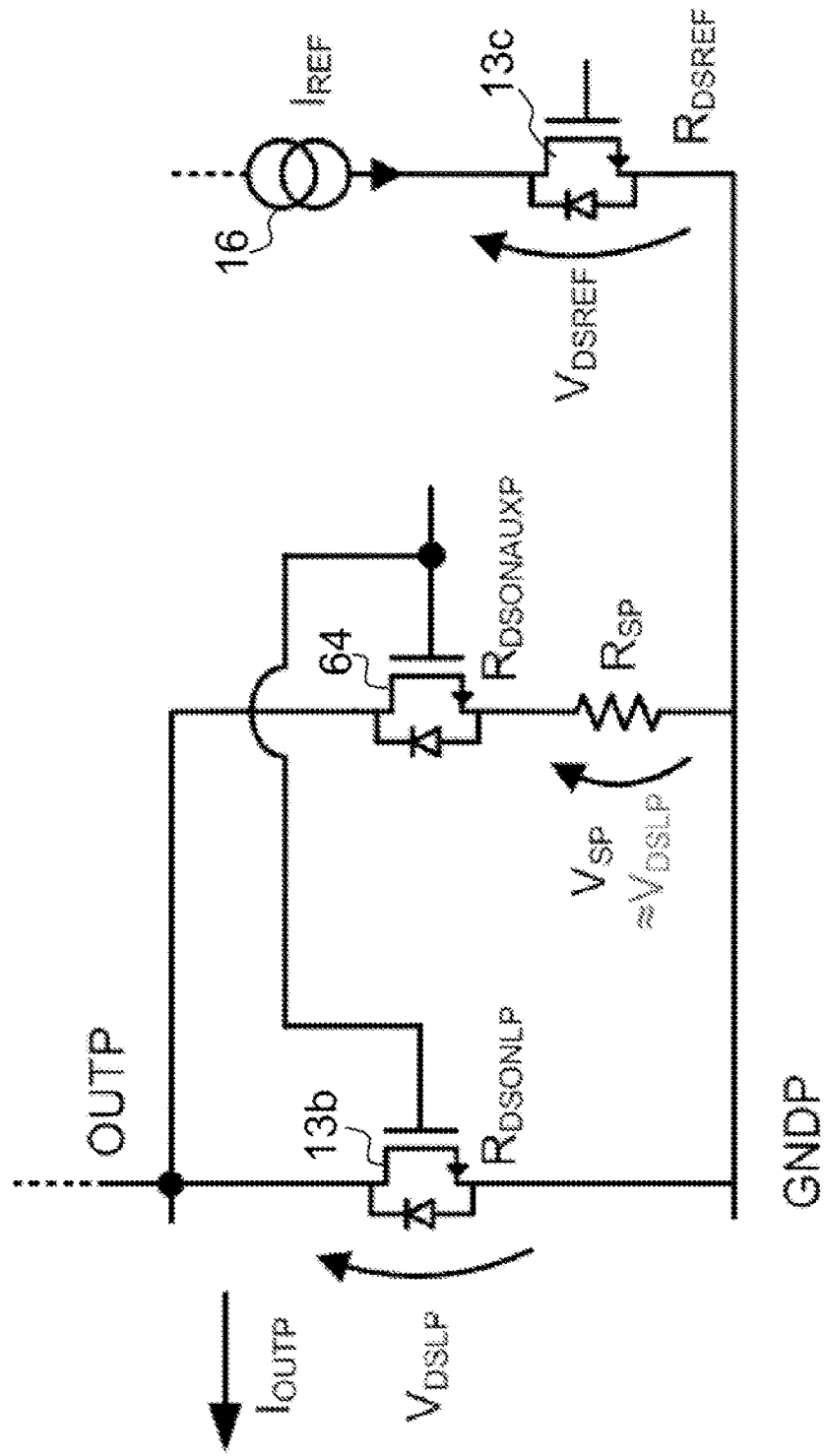
FIG. 11 shows the sensing circuit of FIG. 9 according to a first operating configuration.

In greater detail, with reference to the diagram of FIG. 11, in the first, sensing, mode the drain-to-source voltage $V_{DSLP}$ of the low-side transistor 13b is measured.

Figure 4:
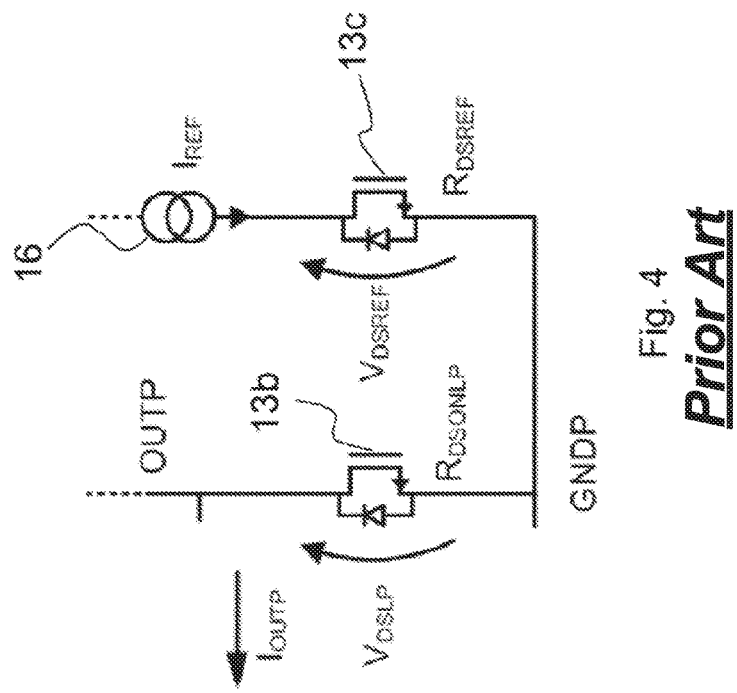
FIG. 4 illustrates a reference power MOSFET.

To obtain the information of current, as described with reference to FIG. 4, it is necessary to compare the measured drain-to-source voltage $V_{DSLP}$ of the low-side transistor 13b with the reference voltage $V_{DSREF}$ resulting from a known current, the reference current $I_{REF}$, that flows in the reference MOS transistor 13c coupled to the low-side transistor 13b according to the relation:

$$I_{OUT} \approx -(I_{REF} \cdot (R_{DSREF}/R_{DSONLP})) \cdot (V_{SP}/V_{DSREF})$$

where $(I_{REF} \cdot (R_{DSREF}/R_{DSONLP}))$ is a term the values of which are known design values and $(V_{SP}/V_{DSREF})$ is a term the values of which are measured. More specifically, of the term $(V_{SP}/V_{DSREF})$ only the value of the ratio is measured, for example using an ADC, where the full-scale is regulated by the reference drain-to-source voltage $V_{DSREF}$, and the voltage to be converted is the sense voltage $V_{SP}$, so that the output of the converter depends in actual fact only upon the ratio between the two values.

The first, sensing, mode presents the following advantages: no thermal matching between the low-side transistor 13b (or 23b) and the auxiliary transistor 64 is required; the layout is simplified; the signal to be amplified is the maximum one available in so far as the drain-to-source voltage VDSLP of the low-side transistor is not partitioned; and the reading electronics is simplified.

Since the non-linearity of the drain-to-source voltage $V_{DSLP}$ of the low-side transistor as a function of current causes a non-linearity in the reading, the first, sensing, mode is preferable in the cases of relatively low drain-to-source voltages, in which the effect of non-linearity is negligible.

Figure 12:
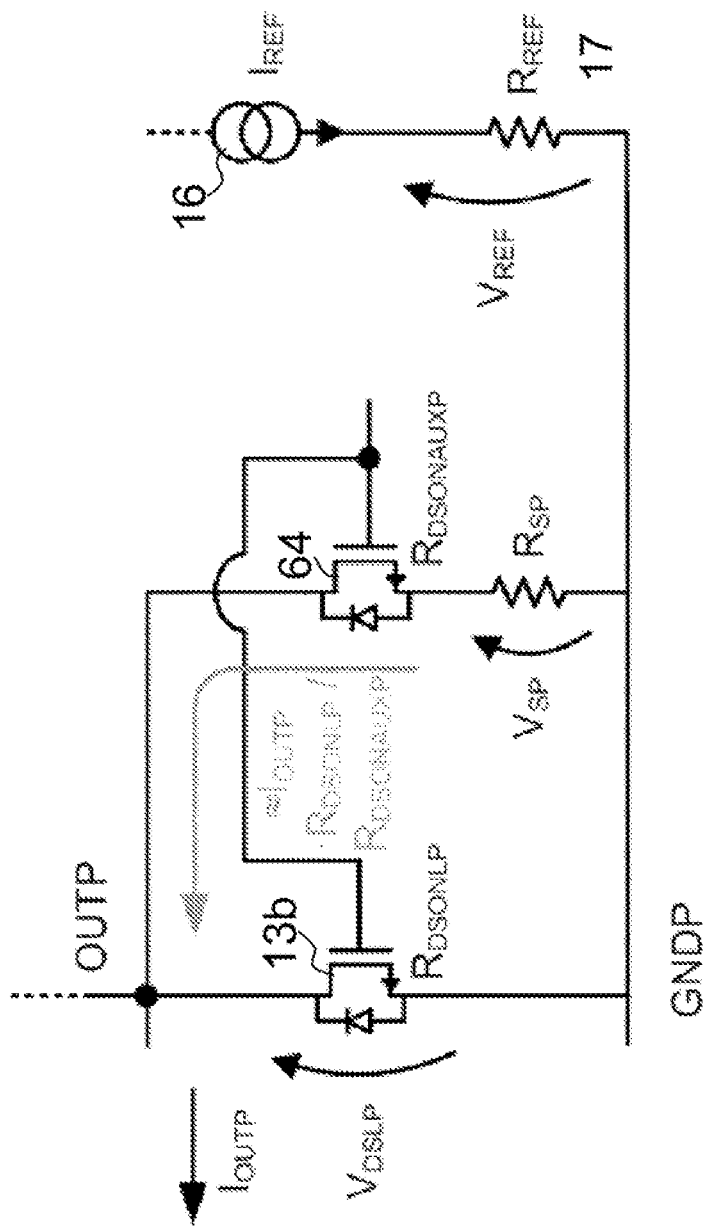
FIG. 12 shows the sensing circuit of FIG. 9 according to a second operating configuration.

With reference to the diagram of FIG. 12, in the second, partitioning, mode a partitioning of the current that flows in the low-side transistor 13b is measured.

To obtain the information of current, it is necessary to compare the sense voltage $V_{SP}$ with a reference constituted by the known current $I_{REF}$ that flows in a reference resistance 17 of value $R_{REF}$ coupled to the sense resistance $R_{SP}$, i.e., connected between the generator 16 of reference current $I_{REF}$ and ground GNDP, on which there is a reference voltage drop $V_{REF}$, according to the relation:

$$I_{OUT} \approx -(I_{REF} \cdot (R_{REF}/R_{SP}) \cdot (R_{DSONAUXP}/R_{DSONLP})) \cdot (V_{SP}/V_{REF}),$$

where $(I_{REF} \cdot (R_{REF}/R_{SP}) \cdot (R_{DSONAUXP}/R_{DSONLP}))$ is a term the values of which are known design values, and $(V_{SP}/V_{REF})$ is a term the values of which, or the value of their ratio, are/is measured. It should be noted that to obtain a measurement of $I_{OUT}$ independent of temperature and process, the measurement must depend upon ratios of resistances of the same type, so that the process or temperature variations cancel out, the measurements amounting only to ratios of areas. Hence, $R_{REF}/R_{SP}$ is a ratio between values of two resistors, $R_{DSONAUXP}/R_{DSONLP}$ is a ratio between values of two MOSFETs in the ohmic region (the sense resistance $R_{SP}$ must be much lower than the switch-on resistance $R_{DSONLP}$ of the low-side transistor 13b so that the power MOSFET 13b and the auxiliary MOS transistor 62 work as far as possible in the same condition, i.e., the same gate-to-source voltage $V_{Gs}$ and the same drain-to-source voltage $V_{SP}$).

This second, partitioning, mode presents, as compared to the first mode, the advantage that the effect of the non-linearity of the drain-to-source voltage of the low-side transistor is limited, and hence the measurement can be very linear.

On the other hand, accurate thermal and electrical matching is required between the low-side transistor, for example 13b, and the auxiliary transistor 64, so as to guarantee a well-controlled partitioning. For this reason, the layout of the power transistors is more complex. There is also required good thermal and electrical matching between the sense resistors $R_{SP}$ and $R_{REF}$. The sense resistance $R_{SP}$ may be of a very small value so as to be negligible as compared to the resistance of the auxiliary switch, this possibly resulting in a complex layout of the sense resistance, whilst the signal to be amplified may be very small, thus rendering the reading electronics more critical.

The second, partitioning, mode is hence preferable in the cases where the effect of the non-linearity of the drain-to-source voltage is not acceptable. Instead, the first, sensing, mode in any case presents advantages in terms of complexity of the layout and simplicity of the reading circuit.

Hence, the advantages of the solution described emerge clearly from the foregoing description.

The class-D audio amplifier comprising a circuit for reading a current supplied by the amplifier to the load described herein advantageously provides a continuous-time reading method that enables a greater accuracy in so far as the operation of averaging eliminates the contribution of the zero-mean ripple of the current in the finite inductance of the LC filter.

Moreover, this amplifier advantageously enables reading of the current even in the absence of the LC filter, thus eliminating the band limitations.

Furthermore, this amplifier advantageously enables intrinsic elimination of the saturation of the reading system for high values of duty cycle.

Finally, this amplifier advantageously enables elimination of the circuits for generation of signals for the sample and hold circuit.

In addition, the use of a sensing network in the amplifier described enables automatic protection of the reading electronics from high voltage.

Moreover, advantageously, via simple sizing of a sense resistance, the sensing network is readily configurable for use in sensing mode with simpler layout and reading electronics, or in partitioning mode, which is less sensitive to non-linear behaviours. In particular, dependence of the measurement upon the non-linearity of the drain-to-source current-voltage characteristic of the MOSFET of the half-bridge, acquired on which is the output current, is eliminated.

Of course, without prejudice to the principle of the invention, the details and the embodiments may vary, even considerably, with respect to what has been described herein purely by way of example, without thereby departing from the sphere of protection, which is defined in the annexed claims.

The class-D audio amplifier apparatus comprising a circuit for reading a load current supplied by the amplifier apparatus to a load described herein may envisage reading, for estimating the load current, a current supplied at output by a half-bridge by measuring a drain-to-source voltage ($V_{DSLP}$) during an ON period of the high-side (n-channel or p-channel) power MOSFETs, instead of carrying out the measurement on the low-side ones, even though it is in general more convenient to operate with a circuit referenced to ground, rather than with a circuit referenced to the supply voltage. In the case of high-side p-channel transistors a complementary equivalent solution is used, with the sources connected to the supply voltage.

What is claimed is:

1. A circuit comprising:
   a final stage of a class-D amplifier that includes an H-bridge comprising a first half-bridge and a second half-bridge; and
   a sensing circuit configured to estimate a load current flowing through a load coupled to the H-bridge by
   sensing a first drain-to-source voltage of a first transistor of the first half-bridge,
   sensing a second drain-to-source voltage of a first transistor of the second half-bridge,
   computing a difference between the first drain-to-source voltage and the second drain-to-source voltage, and
   performing an averaging operation on the difference to obtain a sense voltage value.

2. The circuit according to claim 1, wherein the first transistor of the first half-bridge comprises a low-side transistor, and the first transistor of the second half-bridge comprises a low-side transistor.

3. The circuit according to claim 1, wherein the sensing circuit comprises a differential amplifier coupled to the first transistor of the first half-bridge and the first transistor of the second half-bridge, the differential amplifier being configured to compute the difference between the first drain-to-source voltage and the second drain-to-source voltage.

4. The circuit according to claim 3, wherein the sensing circuit further comprises a low-pass filter coupled to an output of the differential amplifier, the low-pass filter being configured to perform the averaging operation on the difference to obtain the sense voltage value.

5. The circuit according to claim 1, wherein the sensing circuit comprises respective protection switches set between drain and source nodes of the first transistors of the first half-bridge and of the second half-bridge and inputs of a differential amplifier of the sensing circuit, the differential amplifier configured to compute the difference between the first drain-to-source voltage and the second drain-to-source voltage.

6. The circuit according to claim 1, wherein the sensing circuit comprises a sensing network that includes an auxiliary transistor with a gate and a drain, wherein
   the gate of the auxiliary transistor is coupled to a gate of the first transistor of the first half-bridge and a drain of the auxiliary transistor is coupled to a drain of the first transistor of the first half-bridge.

7. The circuit according to claim 6, wherein the sensing network further comprises a sense resistance between a source of the auxiliary transistor and a ground of the first half-bridge.

8. The circuit according to claim 7, wherein the sense resistance is sized so that the sense resistance has a higher value than a switch-on resistance of the auxiliary transistor, such as to render a sum of the switch-on resistance of the auxiliary transistor and of the sense resistance approximately equal to the sense resistance.

9. The circuit according to claim 7, wherein the sense resistance is sized so that the sense resistance has a lower value than a switch-on resistance of the auxiliary transistor, such as to render a sum of a switch-on resistance of the auxiliary transistor and of the sense resistance approximately equal to the switch-on resistance.

10. A method for estimating a load current supplied by a class-D audio amplifier to a load, the method comprising:
    sensing a first drain-to-source voltage of a first transistor of a first half-bridge of an H-bridge of a final stage of the class-D audio amplifier;

sensing a second drain-to-source voltage of a first transistor of a second half-bridge of the H-bridge of the final stage of the class-D audio amplifier;
computing a difference between the first drain-to-source voltage and the second drain-to-source voltage; and
performing an averaging operation on the difference to obtain a sense voltage value.

11. The method according to claim 10, further comprising supplying the sense voltage value to an analog-to-digital converter (ADC).

12. A circuit comprising
a final stage of a class D audio amplifier that includes an H-bridge comprising a first half-bridge and a second half-bridge; and
a sensing circuit comprising a differential amplifier and a low-pass filter, the sensing circuit configured to detect a first drain-to-source voltage from a first transistor of the first half-bridge and a second drain-to-source voltage from a first transistor of the second half-bridge, wherein the differential amplifier is configured to compute a difference between the first drain-to-source voltage and the second drain-to-source voltage, and wherein the low-pass filter is configured to perform an averaging operation on the difference to obtain a sense voltage value.

13. The circuit according to claim 12, wherein the sensing circuit comprises respective protection switches set between drain and source nodes of the first transistors of the first half-bridge and of the second half-bridge and inputs of the differential amplifier.

14. The circuit according to claim 12, wherein the sensing circuit comprises a sensing network that includes an auxiliary transistor with a gate and a drain, wherein the gate of the auxiliary transistor is coupled to a gate of the first transistor of the first half-bridge and wherein a drain of the auxiliary transistor is coupled to a drain of the first transistor of the first half-bridge.

15. The circuit according to claim 14, wherein the sensing circuit further comprises a sense resistance between a source of the auxiliary transistor and ground of the first half-bridge.

16. The circuit according to claim 15, wherein the sense resistance is sized so that the sense resistance has a higher value than a switch-on resistance of the auxiliary transistor, such as to render a sum of the switch-on resistance of the auxiliary transistor and of the sense resistance approximately equal to the sense resistance.

17. The circuit according to claim 16, wherein the sense resistance is sized so that the sense resistance has a lower value than a switch-on resistance of the auxiliary transistor, such as to render a sum of a switch-on resistance of the auxiliary transistor and of the sense resistance approximately equal to the switch-on resistance.

18. The circuit according to claim 3, wherein the differential amplifier comprises a low-pass filter configured to perform the averaging operation on the difference to obtain the sense voltage value.

19. The circuit according to claim 1, further comprising an analog-to-digital converter (ADC) configured to receive the sensed voltage value.

20. A method comprising:
sensing a first current flowing through a first transistor of a first half-bridge of an H-bridge;
sensing a second current flowing through a first transistor of a second half-bridge of the H-bridge;
computing a difference between the first current and the second current; and
performing an averaging operation on the difference, wherein:
sensing the first current comprises sensing a first drain-to-source voltage of the first transistor of the first half-bridge;
sensing the second current comprises sensing a second drain-to-source voltage of the first transistor of the second half-bridge; and
computing the difference between the first current and the second current comprises computing a difference between the first drain-to-source voltage and the second drain-to-source voltage.

* * * * *